(12) United States Patent
Sagong et al.

(10) Patent No.: US 11,245,018 B2
(45) Date of Patent: Feb. 8, 2022

(54) SEMICONDUCTOR DEVICE INCLUDING A GATE STRUCTURE WITH A WIDER END PORTION THAN A LINEAR PORTION

(71) Applicant: SAMSUNG ELECTRONICS CO., LTD., Suwon-si (KR)

(72) Inventors: Hyun Chul Sagong, Hwaseong-si (KR); Sung Eun Kim, Hwaseong-si (KR); Jin Woo Kim, Seoul (KR); June Kyun Park, Seongnam-si (KR); Sang Woo Pae, Suwon-si (KR); Ki Hyun Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/415,633

(22) Filed: May 17, 2019

(65) Prior Publication Data

US 2020/0144384 A1 May 7, 2020

(30) Foreign Application Priority Data

Nov. 2, 2018 (KR) ........................ 10-2018-0133480

(51) Int. Cl.
| | | |
|---|---|---|
| *H01L 29/423* | (2006.01) | |
| *H01L 27/088* | (2006.01) | |
| *H01L 27/02* | (2006.01) | |
| *H01L 27/092* | (2006.01) | |
| *H01L 27/11* | (2006.01) | |
| *H01L 29/66* | (2006.01) | |

(Continued)

(52) U.S. Cl.
CPC .... *H01L 29/42376* (2013.01); *H01L 27/0207* (2013.01); *H01L 27/0886* (2013.01); *H01L 27/0924* (2013.01); *H01L 27/1104* (2013.01); *H01L 29/42368* (2013.01); *H01L 29/66545* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/04–045; H01L 29/16–1608; H01L 29/18–185; H01L 29/22–2206; H01L 29/36–365; H01L 29/41791; H01L 29/66795–66818; H01L 29/785–7856; H01L 2924/13067; H01L 2029/7857–7858
See application file for complete search history.

(56) References Cited

U.S. PATENT DOCUMENTS

| | | |
|---|---|---|
| 8,003,466 B2 | 8/2011 | Shi et al. |
| 8,183,644 B1 | 5/2012 | Chuang et al. |
| 9,064,932 B1 | 6/2015 | Pham et al. |

(Continued)

*Primary Examiner* — Maliheh Malek
(74) *Attorney, Agent, or Firm* — F. Chau & Associates, LLC (57) ABSTRACT

A semiconductor device may include an active region extending primarily in a first direction on a substrate. A gate structure may be disposed to intersect the active region, and extend primarily in a second direction intersecting the first direction. A gate isolation pattern may contact one end of the gate structure. The gate structure may include a plurality of portions each having different widths in the first direction, and the gate isolation pattern may have a width greater than a width of at least one of the plurality of portions of the gate structure.

20 Claims, 7 Drawing Sheets

(51) Int. Cl.
*H01L 21/8234* (2006.01)
*H01L 21/84* (2006.01)

(56) References Cited

U.S. PATENT DOCUMENTS

| | | | | |
|---|---|---|---|---|
| 9,331,074 | B1* | 5/2016 | Chang | H01L 27/0886 |
| 9,373,641 | B2 | 6/2016 | Anderson et al. | |
| 9,559,100 | B2* | 1/2017 | Chang | H01L 21/823431 |
| 9,601,567 | B1* | 3/2017 | Hsieh | H01L 21/28123 |
| 9,741,854 | B2* | 8/2017 | Bai | H01L 29/7848 |
| 9,899,267 | B1* | 2/2018 | Liou | H01L 21/823878 |
| 9,911,736 | B1* | 3/2018 | Zang | H01L 29/66545 |
| 9,935,103 | B2* | 4/2018 | Chang | H01L 27/0886 |
| 9,954,076 | B2* | 4/2018 | Yu | H01L 21/76232 |
| 10,014,304 | B2* | 7/2018 | Park | H01L 21/0217 |
| 10,043,807 | B1* | 8/2018 | Lee | H01L 29/6653 |
| 10,121,704 | B2* | 11/2018 | Liou | H01L 21/823431 |
| 10,157,746 | B2* | 12/2018 | Hsieh | H01L 21/823437 |
| 10,269,802 | B2* | 4/2019 | Lin | H01L 29/495 |
| 10,283,503 | B2* | 5/2019 | Huang | H01L 29/4966 |
| 10,332,898 | B2* | 6/2019 | Hong | H01L 27/1108 |
| 10,446,663 | B2* | 10/2019 | Yin | H01L 29/7853 |
| 10,522,409 | B2* | 12/2019 | Tsai | H01L 21/823481 |
| 10,535,746 | B2* | 1/2020 | Lee | H01L 21/823821 |
| 10,607,896 | B2* | 3/2020 | Ragnarsson | H01L 29/66545 |
| 10,784,344 | B2* | 9/2020 | Song | H01L 29/78696 |
| 10,930,544 | B2* | 2/2021 | Kang | H01L 21/76224 |
| 2015/0115373 | A1* | 4/2015 | Yu | H01L 21/823418 |
| | | | | 257/401 |
| 2015/0371892 | A1* | 12/2015 | Xie | H01L 21/3065 |
| | | | | 257/401 |
| 2016/0133632 | A1* | 5/2016 | Park | H01L 29/66545 |
| | | | | 257/369 |
| 2016/0141388 | A1* | 5/2016 | Baek | H01L 29/66795 |
| | | | | 438/595 |
| 2016/0149008 | A1* | 5/2016 | Kim | H01L 27/228 |
| | | | | 257/295 |
| 2016/0181399 | A1* | 6/2016 | Jun | H01L 29/41791 |
| | | | | 438/294 |
| 2016/0225764 | A1* | 8/2016 | Chang | H01L 21/823864 |
| 2016/0336320 | A1* | 11/2016 | Lin | H01L 29/495 |
| 2017/0110454 | A1* | 4/2017 | Chang | H01L 21/823878 |
| 2017/0263706 | A1* | 9/2017 | Gardner | H01L 29/66545 |
| 2018/0144988 | A1* | 5/2018 | Liou | H01L 29/66795 |
| 2018/0165397 | A1 | 6/2018 | Chang et al. | |
| 2018/0166327 | A1 | 6/2018 | Hsiao et al. | |
| 2018/0174909 | A1 | 6/2018 | Xiao et al. | |
| 2018/0204836 | A1 | 7/2018 | Lin et al. | |
| 2019/0027410 | A1* | 1/2019 | Liou | H01L 21/823481 |
| 2019/0148374 | A1* | 5/2019 | Bae | H01L 21/76897 |
| | | | | 257/401 |
| 2019/0148539 | A1* | 5/2019 | Yang | H01L 21/823821 |
| | | | | 257/401 |
| 2019/0378903 | A1* | 12/2019 | Jeon | H01L 21/764 |
| 2020/0066725 | A1* | 2/2020 | Bhuwalka | H01L 29/78696 |
| 2020/0083222 | A1* | 3/2020 | Kim | H01L 29/785 |
| 2020/0098681 | A1* | 3/2020 | Kim | H01L 21/76897 |

* cited by examiner

SEMICONDUCTOR DEVICE INCLUDING A GATE STRUCTURE WITH A WIDER END PORTION THAN A LINEAR PORTION

CROSS-REFERENCE TO RELATED APPLICATION

This application claims priority under 35 U.S.C. § 119 to Korean Patent Application No. 10-2018-0133480 filed on Nov. 2, 2018 in the Korean Intellectual Property Office, the disclosure of which is incorporated by reference herein in its entirety.

TECHNICAL FIELD

Example embodiments of the present inventive concept relate to a semiconductor device, and more particularly, to a semiconductor device including a gate structure with a wider end portion than a linear portion.

DISCUSSION OF RELATED ART

Demand has increased for semiconductor devices that implement high performance, high speed and/or multiple functions, and increased integration density. To satisfy the demand for high integration density of semiconductor devices, patterns with fine widths or fine isolation distances have been used. To overcome a short channel effect, a semiconductor device including a fin field-effect transistor (FinFET) having a three-dimensional structure or a gate-all-around (GAA) transistor has been developed.

SUMMARY

According to an example embodiment of the present inventive concept, a semiconductor device may include an active region extending primarily in a first direction on a substrate. A gate structure may be disposed to intersect the active region, and extend primarily in a second direction intersecting the first direction. A gate isolation pattern may contact one end of the gate structure. The gate structure may include a plurality of portions each having different widths in the first direction, and the gate isolation pattern may have a width greater than a width of at least one of the plurality of portions of the gate structure.

According to an example embodiment of the present inventive concept, a semiconductor device may include a first active region and a second active region extending primarily in a first direction on a substrate. A first gate structure and a second gate structure may extend primarily in a second direction intersecting the first direction, and may be disposed adjacent to each other in the second direction. A gate isolation pattern may be disposed between the first gate structure and the second gate structure. The first gate structure may include a first linear portion and a first end portion, and a maximum width of the first end portion may be greater than a maximum width of the first linear portion. The second gate structure may include a second linear portion and a second end portion, and a maximum width of the second end portion may be greater than a maximum width of the second linear portion.

According to an example embodiment of the present inventive concept, a semiconductor device may include a static random access memory cell (SRAM). The SRAM may include a pair of outermost p-type active regions extending in the first direction and a pair of n-type active regions disposed between the pair of outermost p-type active regions and extending in parallel thereto. An n-type pull-down transistor including a linear portion and an end portion may be provided. The n-type pull-down transistor may extend in the second direction and intersect an outermost p-type active region. A p-type pull-up transistor may intersect the pair of n-type active regions and may include a linear portion and an end portion. The linear portion may be disposed directly on the end portion of the n-type pull-down transistor, and may extend in the second direction. A gate isolation pattern, including first and second end surfaces, may be disposed on the end portion of the p-type pull-up transistor at a first end surface, and may be disposed on an end portion of an n-type pass transistor at a second end surface.

The n-type pass transistor may intersect the other outermost p-type active region.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Example embodiments of the present inventive concept will now be described more fully with reference to the accompanying drawings. However, the inventive concepts may be embodied in many alternate forms and should not be construed as limited to only the exemplary embodiments of the present disclosure set forth herein. It shall be understood that like reference numerals may refer to like elements throughout the detailed description and accompanying figures.

Figure 1:
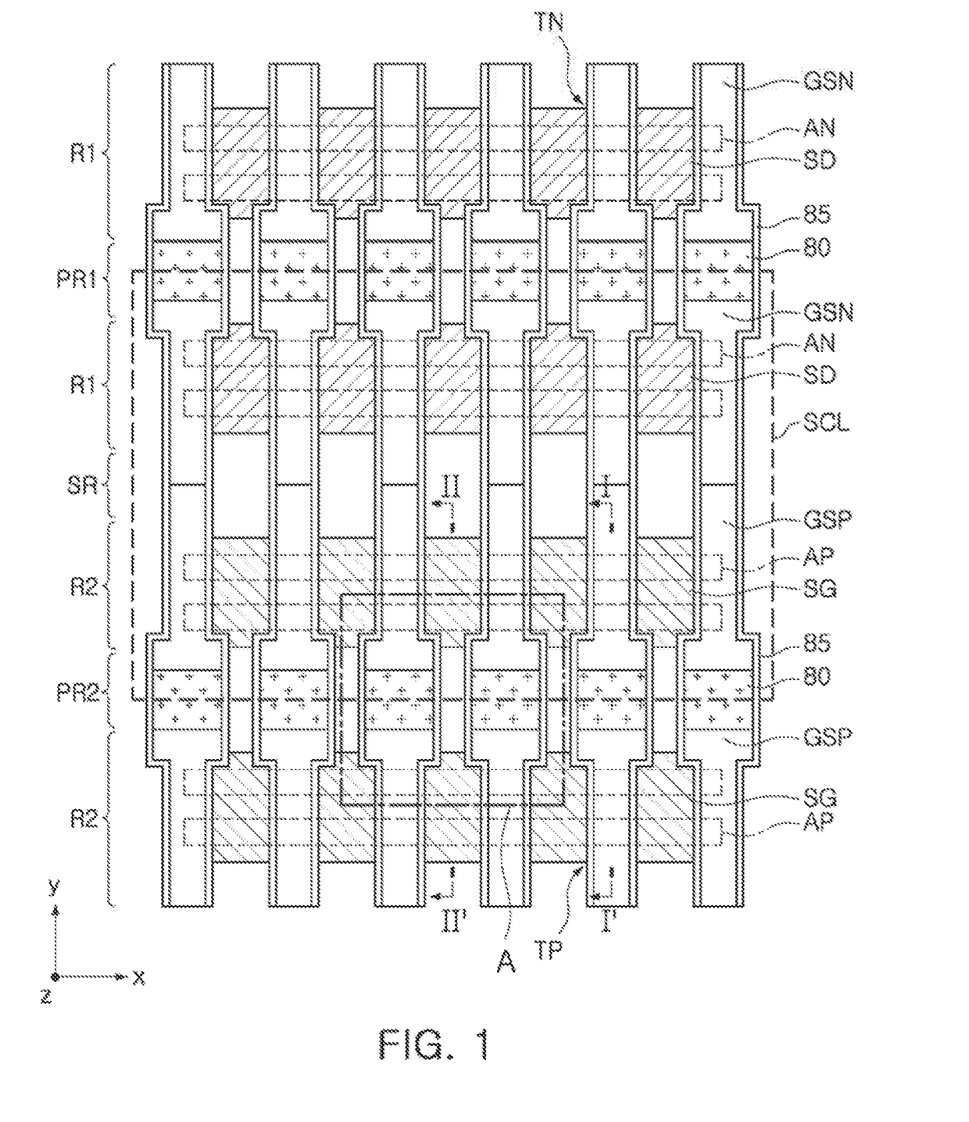
FIG. 1 is a plan view illustrating a semiconductor device according to an example embodiment of the present inventive concept.
Figure 2:
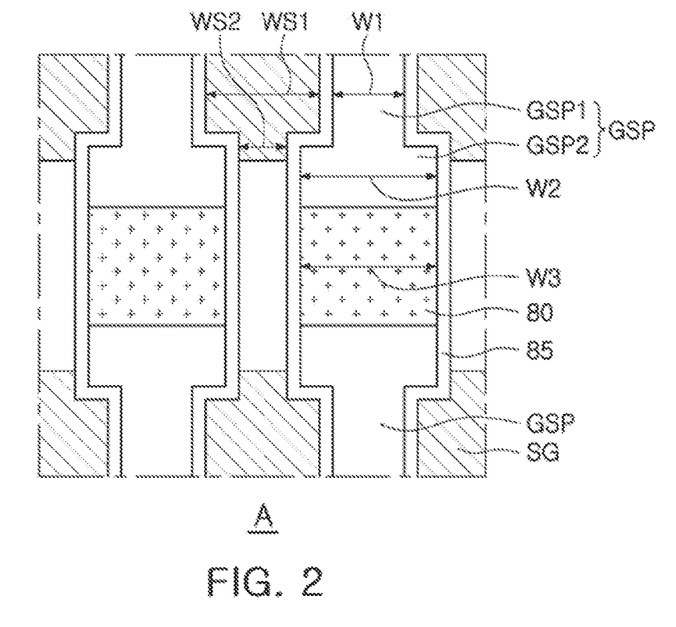
FIG. 2 is an enlarged plan view illustrating region "A" of FIG. 1 according to an example embodiment of the present inventive concept.
Figure 3:
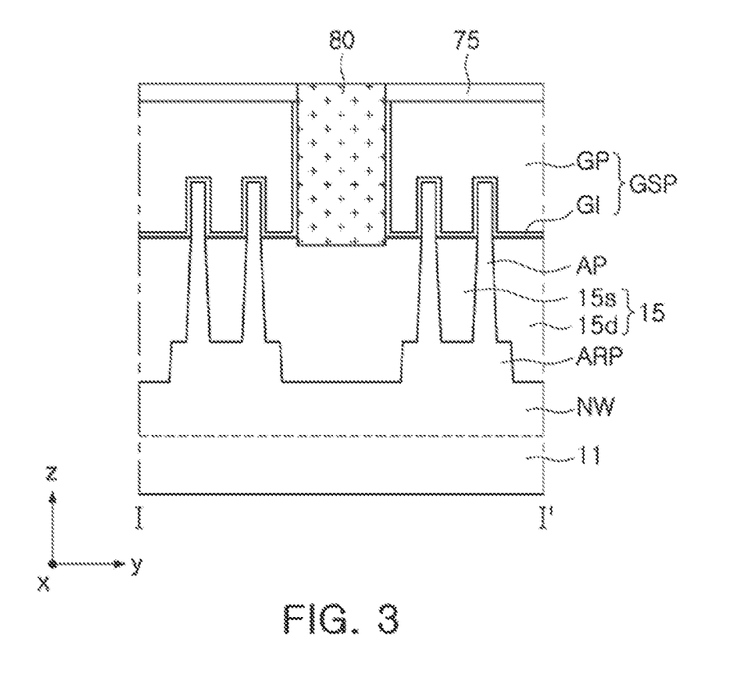
FIG. 3 is a cross-sectional view illustrating the semiconductor device in FIG. 1 taken along lines I-I'.
Figure 4:
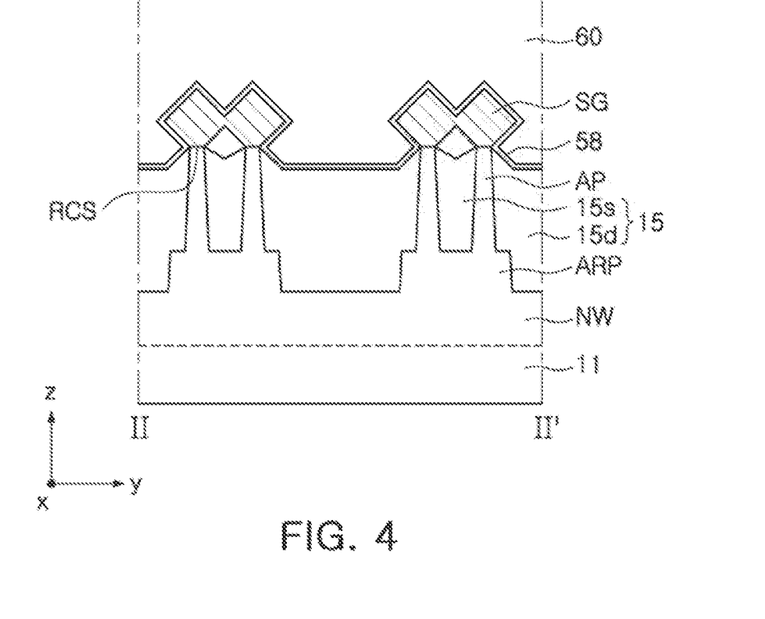
FIG. 4 is a cross-sectional view illustrating the semiconductor device in FIG. 1 taken along lines II-II'.

FIG. 1 is a plan view illustrating a semiconductor device according to an example embodiment of the present inventive concept. FIG. 2 is an enlarged plan view of region "A" in FIG. 1 illustrating an example embodiment of the present inventive concept. FIG. 3 is a cross-sectional view taken along lines I-I' of the semiconductor device illustrated in FIG. 1. FIG. 4 is a cross-sectional view taken along lines II-II' of the semiconductor device illustrated in FIG. 1.

Referring to FIGS. 1 and 2, a semiconductor device according to an example embodiment of the present inventive concept may include logic standard cells SCL disposed on a substrate. The logic standard cells SCL may each include a first device region R1, a second device region R2, a separation region SR disposed between the first device region R1 and the second device region R2, a first power rail region PR1 adjacent to the first device region R1, and a second power rail region PR2 adjacent to the second device region R2.

N-type transistors TN may be disposed in the first device region R1, and P-type transistors TP may be disposed in the second device region R2. The N-type transistors TN and the P-type transistors TP may include fin field-effect transistors, (FinFETs).

The first device region R1 may include P-type active regions AN extending in a first direction (e.g. x direction), first gate structures GSN extending in a second direction (e.g. y direction) to intersect the P-type active regions AN, and N-type source/drain layers SD disposed on the P-type active regions AN between the first gate structures GSN. The second device region R2 may include N-type active regions AP extending in the first direction (e.g. x direction), second gate structures GSP extending in the second direction (e.g. y direction) to intersect the N-type active regions AP, and P-type source/drain layers SG disposed on the N-type active regions AP between the second gate structures GSP.

As an example, two P-type active regions AN may be included in the first device region R1, two N-type active regions AP may be included in the second device region R2, and the number of the P-type active regions AN and the number of the N-type active regions AP may vary. The P-type active regions AN and the N-type active regions AP may include fin-type active regions and/or active fins protruding from the substrate.

The N-type transistors TN may include the P-type active regions AN, the first gate structures GSN, and the N-type source/drain layers SD, and the P-type transistors TP may include the N-type active regions AP, the second gate structures GSP, and the P-type source/drain layers SG. Each of the N-type source/drain layers SD and the P-type source/drain layers SG may include, for example, silicon germanium (SiGe), silicon (Si), and silicon carbide (SiC).

The first gate structures GSN and the second gate structures GSP may contact each other in the separation region SR. The first gate structures GSN and the second gate structures GSP may each include a linear portion and an end portion adjacent to the linear portion, and a maximum width of the end portion may be greater than a maximum width of the linear portion.

Gate isolation patterns 80 may be disposed between the first gate structures GSN and between the second gate structures GSP in the second direction (e.g. y direction). One end of the first gate structures GSN may contact a gate isolation pattern 80 in the first power rail region PR1, and one end of the second gate structures GSP may contact a gate isolation pattern 80 in the second power rail region PR2.

Gate spacers 85 may be disposed on side surfaces of the first gate structures GSN and the second gate structures GSP. The gate spacers 85 may extend continuously in the second direction (e.g. y direction) along the side surfaces of the first gate structures GSN and the second gate structures GSP.

The first gate structures GSN and the second gate structures GSP may include portions having different widths in the first direction (e.g. x direction). Accordingly, the gate spacers 85 may include bent portions.

Referring to FIG. 2, the second gate structure GSP may include a linear portion GSP1 having a first width W1 in the first direction (e.g. x direction), and an end portion GSP2 in contact with the gate isolation pattern 80 and having a second width W2 greater than the first width W1. The gate isolation pattern 80 may have a third width W3 in the first direction (e.g. x direction). The third width W3 of the gate isolation pattern 80 may be the same as the second width W2 of the end portion GSP2 of the gate structure GSP.

The P-type source/drain layer SG may include a first portion adjacent to the linear portion GSP1 of the gate structure GSP and having the first width WS1 in the first direction (e.g. x direction), and a second portion adjacent to the end portion GSP2 of the second gate structure GSP and having the second width WS2 in the first direction (e.g. x direction). The second width WS2 may be smaller than the first width WS1.

In the description for FIG. 2 above, the second gate structures GSP and the P-type source/drain layer SG were more fully described. However, the shapes of the first gate structures GSN and the N-type source/drain layer SD may also resemble the shapes of the second gate structures GSP and the P-type source/drain layer SG, respectively.

When the gate structures of the transistors are manufactured using a gate last process, a dummy gate structure including a dummy gate formed of, for example, polycrystalline silicon, silicon germanium (SiGe), or polycrystalline silicon germanium that may be easily removed during an etching process, and a dummy gate insulating layer formed of silicon oxide may be formed, the source/drain layers may be formed, and the dummy gate and the dummy gate insulating layer may be subsequently removed. The gate structure of a transistor may include a gate insulating layer and a gate electrode disposed in a space left by removal of the dummy gate and the dummy gate insulating layer. However, as the sizes of the transistors are reduced and the sizes of the gate structures are also concomitantly reduced, defects in which the dummy gate and the dummy gate insulating layer are only partially removed may occur at an end portion of the dummy gate structure. As in the example embodiment of the inventive concept, the dummy gate may be formed of Si doped with, for example, phosphorus (P), arsenic (As), boron (B), carbon (C), argon (Ar), nitrogen (N), and fluorine (F).

As in the example embodiment of the inventive concept, by forming the width of the end portion of the gate structure adjacent to the gate isolation pattern to be greater than the width of the linear portion, for example, by first configuring the width of the end portion of the dummy gate structure to be greater than the width of the linear portion, defects may be decreased.

The width of the end portion of the dummy gate structure may be greater than the width of the linear portion by manufacturing a photomask including a gate pattern having an end portion with a width greater than the width of the linear portion, and then performing a photolithography process using the photomask.

Alternatively, a photolithography process may be performed twice using two photomasks for patterning the dummy gate structure. One of the photomasks may include a linear gate pattern, and another photomask may include patterns corresponding to an end portion of the gate pattern. The photomask corresponding to the end portion of the gate pattern may have a width greater than the width of the linear gate pattern. The photolithography process may include an EUV photolithography process and/or an emersion ArF photolithography process.

The semiconductor device may include contact plugs disposed on the N-type source/drain layers SD and the P-type source/drain layers SG.

The first power rail region PR1 may include a first power rail extending in the first direction (e.g. x direction), and disposed parallel to the P-type active regions AN. The second power rail region PR2 may include a second power rail extending in the first direction (e.g. x direction), and may be disposed parallel to the N-type active regions AP. The first power rail and the second power rail may be positioned higher than upper surfaces of the first gate structures GSN and second gate structures GSP, or may be positioned lower than lower surfaces of the first gate structures GSN and second gate structures GSP. The first power rail and the second power rail may provide a power voltage or a ground voltage. For example, the first power rail may provide a power voltage, and the second power rail may provide a ground voltage.

Referring to FIGS. 3 and 4, the semiconductor device may include a substrate 11 including an N-type well region NW. N-type lower active regions ARP may be disposed on the N-type well region NW. N-type active regions AP may protrude from the N-type lower active regions ARP. A device isolation layer 15 may be disposed between the N-type lower active regions ARP and the N-type active regions AP. For example, the device isolation layer 15 may be disposed between the N-type well region NW and a lower surface of the gate insulating layer GI of the second gate structure GSP. Second gate structures GSP may at least partially surround upper portions of the N-type active regions AP. A gate isolation pattern 80 may be disposed between the second gate structures GSP, and P-type source/drain layers SG may be disposed on the N-type active regions AP. The device isolation layer 15 may include a first isolation layer 15s disposed between the N-type active regions AP, and a second isolation layer 15d disposed between the N-type lower active regions ARP.

The substrate 11 may include a group IV semiconductor, a group III-V compound semiconductor, and/or a group II-VI compound semiconductor. For example, the group IV semiconductor may include silicon, germanium, and/or silicon-germanium. According to the example embodiments of the present inventive concept, the substrate 11 may be silicon-on-insulator (SOI) substrate and/or a germanium-on-insulator (GOI) substrate.

The N-type well region NW, the N-type lower active region ARP, and the N-type active region AP may include an N-type dopant. For example, when the substrate 11, the N-type lower active region ARP, and the N-type active region AP are formed of a group IV semiconductor, the N-type dopant may be Phosphorus (P) and/or arsenic (As).

The N-type active regions AP may extend in the first direction (e.g. x direction), and the second gate structures GSP may at least partially surround upper portions of the N-type active regions AP protruding from the device isolation layer IS and may extend in the second direction (e.g. y direction).

The gate isolation pattern 80 may be disposed between adjacent second gate structures GSP in the second direction (e.g. y direction), and may extend in the first direction (x direction). One end of each of the second gate structures GSP may contact the gate isolation pattern 80. The gate isolation patterns 80 may be formed of silicon nitride and/or silicon oxynitride.

The second gate structures GSP may include a gate insulating layer GI and a gate electrode GP, and the gate insulating layer GI may be disposed on upper portions of the N-type active regions AP and a lower portion of the gate electrode GP. For example, the gate insulating layer GI may be disposed between an upper surface of the device isolation layer 15 and a lower surface of the gate electrode GP, and between side surfaces of the gate isolation pattern 80 and the gate electrode GP. An interfacial insulating layer may be disposed between the N-type active regions AP and the gate insulating layer GI. The interfacial insulating layer may include silicon oxide.

The gate insulating layer GI may include silicon oxide, silicon nitride, silicon oxynitride, and/or a high-k material. The high-k material may refer to a dielectric material having a relatively higher dielectric constant than a dielectric constant of a silicon oxide film ($SiO_2$). The high-k material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The gate electrodes GP may include a plurality of layers stacked on the gate insulating layer GI. Some of the plurality of layers may be formed of different materials. The gate electrodes GP may include TiN, TaN, WN, WCN, TiAl, TiAlC, TiAlN, aluminum (Al), tungsten (W), copper (Cu), molybdenum (Mo), and/or doped polysilicon.

The P-type source/drain layers SG may be disposed on recess regions RCS of the N-type active regions AP, and may extend in the second direction (e.g. y direction). The P-type source/drain layers SG disposed on adjacent N-type active regions AP disposed on a single N-type lower active region ARP may be integrated, and may have sloped upper surfaces. The P-type source/drain layers SG may be semiconductor layers including a P-type dopant formed by a selective epitaxial growth from the recess regions RCS of the N-type active regions AP.

An etch stop layer 58 may be disposed on a portion of a surface of the P-type source/drain layer SG, and the etch stop layer 58 may also be disposed on a surface of the device isolation layer 15. An interlayer insulating layer 60 may be disposed on the etch stop layer 58. Contact plugs may penetrate through the interlayer insulating layer 60 and the etch stop layer 58 and may extend to the P-type source/drain layers SG. The etch stop layer 58 may include a silicon nitride film and/or a silicon oxynitride film. The interlayer insulating layer 60 may include a silicon oxide film.

A gate capping layer 75 may be disposed on the second gate structures GSP. The gate capping layer 75 may include at least one of silicon oxide, silicon nitride, and/or silicon oxynitride.

FIGS. 5 to 9 are enlarged plan views of region "A" of the semiconductor device of FIG. 1 illustrating example embodiments of the present inventive concept. Although region "A" depicts the second gate structure specifically, the dimensions and shapes associated with region "A" may also apply to the first gate structures.

Figure 5:
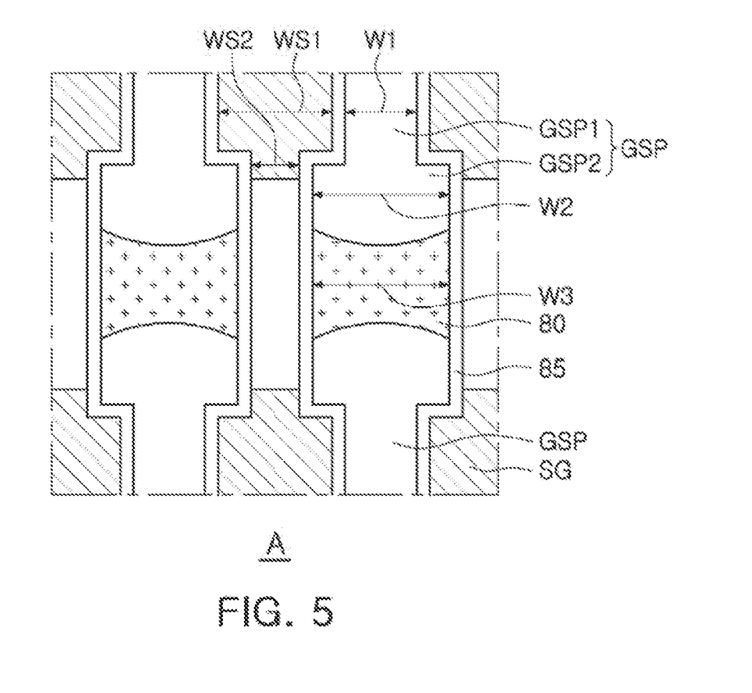
FIGS. 5 to 9 are enlarged plan views illustrating region "A" of the semiconductor device of FIG. 1 according to example embodiments of the present inventive concept.

Referring to FIG. 5, an end portion GSP2 of a second gate structure GSP may have include a convex end surface, for example, convex towards a gate isolation pattern 80. The gate isolation pattern 80 may include a concave end surface corresponding to the convex end surface of the end portion GSP2. A maximum width of the end portion GSP2 in the first direction may be substantially the same as a width of the gate isolation pattern 80 in the first direction.

The gate isolation pattern 80 may include regions having different widths in a second direction (y direction).

Figure 6:
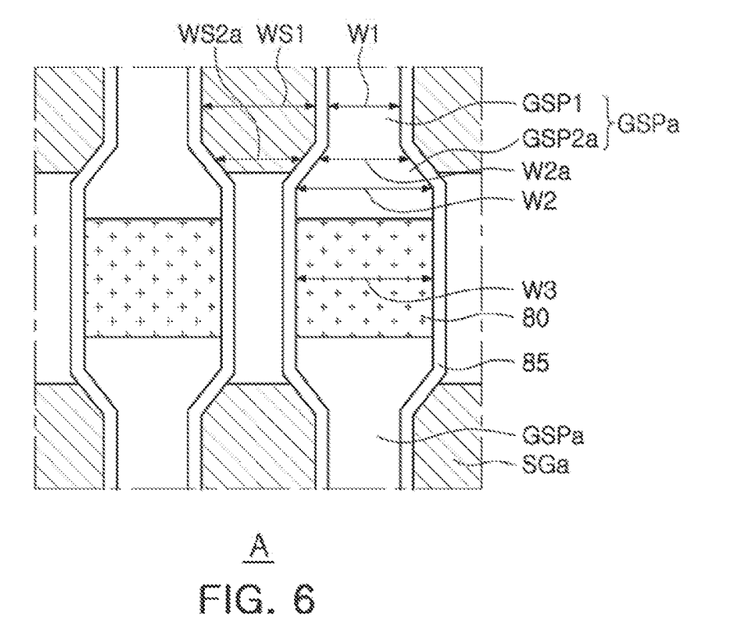

Referring to FIG. 6, an end portion GSP2a of a second gate structure GSPa may include a first region including a width that widens in a direction towards the gate isolation pattern 80, and a second region in contact with the gate isolation pattern 80 and including a second width W2 of a constant size.

According to an example embodiment of the present inventive concept, as illustrated in FIG. 5, the end portion GSP2a of the gate structure GSPa may include a convex end surface disposed on the gate isolation pattern 80, for example, convex towards the gate isolation pattern 80. The gate isolation pattern 80 may include a concave end surface that corresponds to the convex end surface of the end portion GSP2a.

The P-type source/drain layer SGa may include a first portion adjacent to linear portions GSP1 of the second gate structures GSPa and including a first width WS1 in a first direction (e.g. x direction), and a second portion adjacent to an end portion GSP2a of a second gate structure GSPa and having a second width WS2a which gradually narrows. The second width WS2a may be narrower than the first width WS1.

Figure 7:
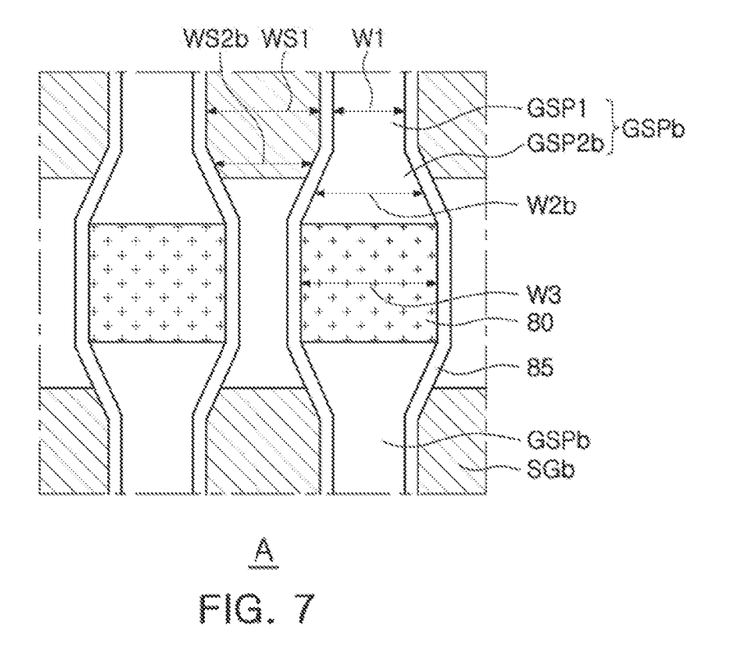

Referring to FIG. 7, an end portion GSP2b of a second gate structure GSPb may include a shape in which a second width W2b gradually widens in a direction towards the gate isolation pattern 80. According to an example embodiment of the present inventive concept, as illustrated in FIG. 5, the end portion GSP2b of the second gate structure GSPb may include a convex end surface disposed on the gate isolation pattern 80, for example, convex in a direction towards the gate isolation pattern 80. The gate isolation patterns 80 may include a concave end surface that corresponds to the convex end surface of the end portion GSP2b.

The P-type source/drain layer SG may include a first portion adjacent to linear portions GSP1 of the second gate structures GSPb and having a first width WS1 in the first direction (e.g. x direction), and a second portion adjacent to an end portion GSP2b of a gate structure GSPb and having a second width WS2a which gradually narrows. The second width WS2b may be narrower than the first width WS1.

Figure 8:
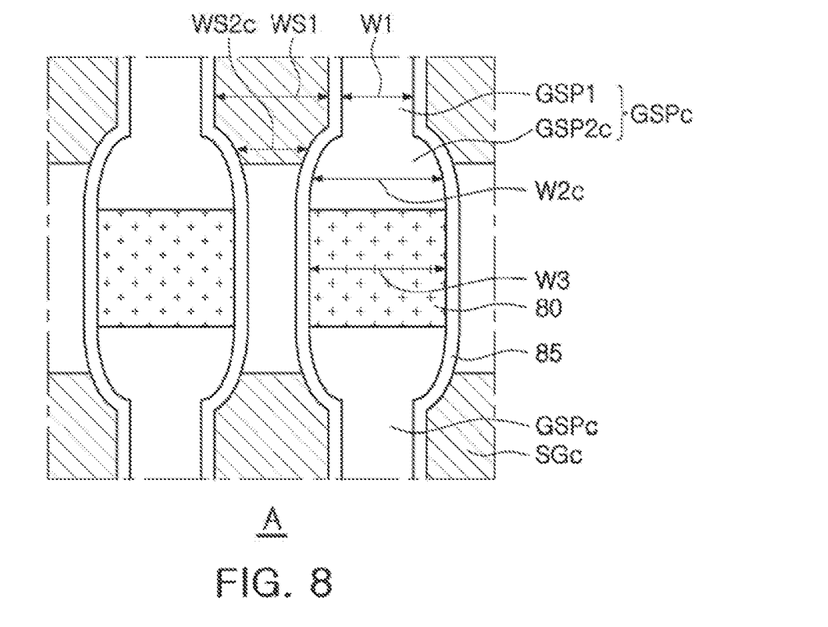

Referring to FIG. 8, an end portion GSP2c of a second gate structure GSPc may have a second width W2c that widens in a direction towards the gate isolation pattern 80, and may have convex side surfaces. According to an example embodiment of the present inventive concept, as illustrated in FIG. 5, the end portion GSP2c of the gate structure GSPc may include a convex end surface disposed on the gate isolation pattern 80, for example, convex towards the gate isolation pattern 80. The gate isolation pattern 80 may include a concave end surface that corresponds to the convex end surface of the end portion GSP2c.

The P-type source/drain layers SGc may include a first portion adjacent to the linear portions GSP1 of the second gate structures GSPc and including a first width WS1 in the first direction (e.g. x direction), and a second portion adjacent to the end portion GSP2c of a second gate structure GSPc, including a second width WS2c which gradually narrows, and includes concave side surfaces. The second width WS2c may be narrower than the first width WS1.

Figure 9:
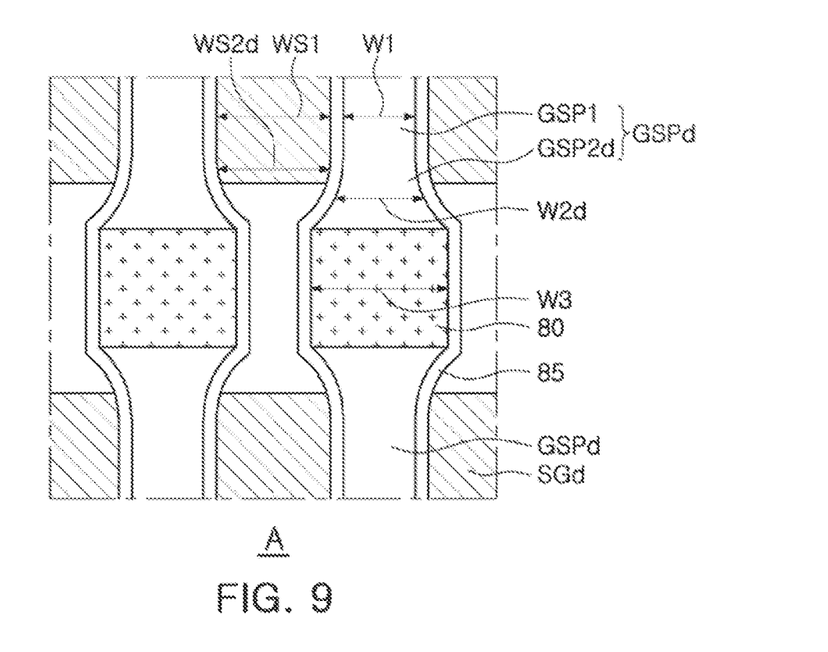

Referring to FIG. 9, an end portion GSP2d of a second gate structure GSPd may have a second width W2d that widens in a direction towards the gate isolation pattern 80, and may include concave side surfaces. According to an example embodiment of the present inventive concept, as illustrated in FIG. 5, the end portion GSP2d of the second gate structure GSPd may include a convex end surface disposed on the gate isolation pattern 80, convex towards the gate isolation pattern 80. The gate isolation pattern 80 may include a concave end surface that corresponds to the convex end surface of the end portion GSP2d.

A P-type source/drain layer SGd may include a first portion adjacent to linear portions GSP1 of the second gate structures GSPd, and including a first width WS1 in the first direction (e.g. x direction), and a second portion adjacent to the end portion GSP2d of the second gate structure GSPd, including a second width WS2d which gradually narrows, and includes convex side surfaces. The second width WS2d may be narrower than the first width WS1.

Figure 10:
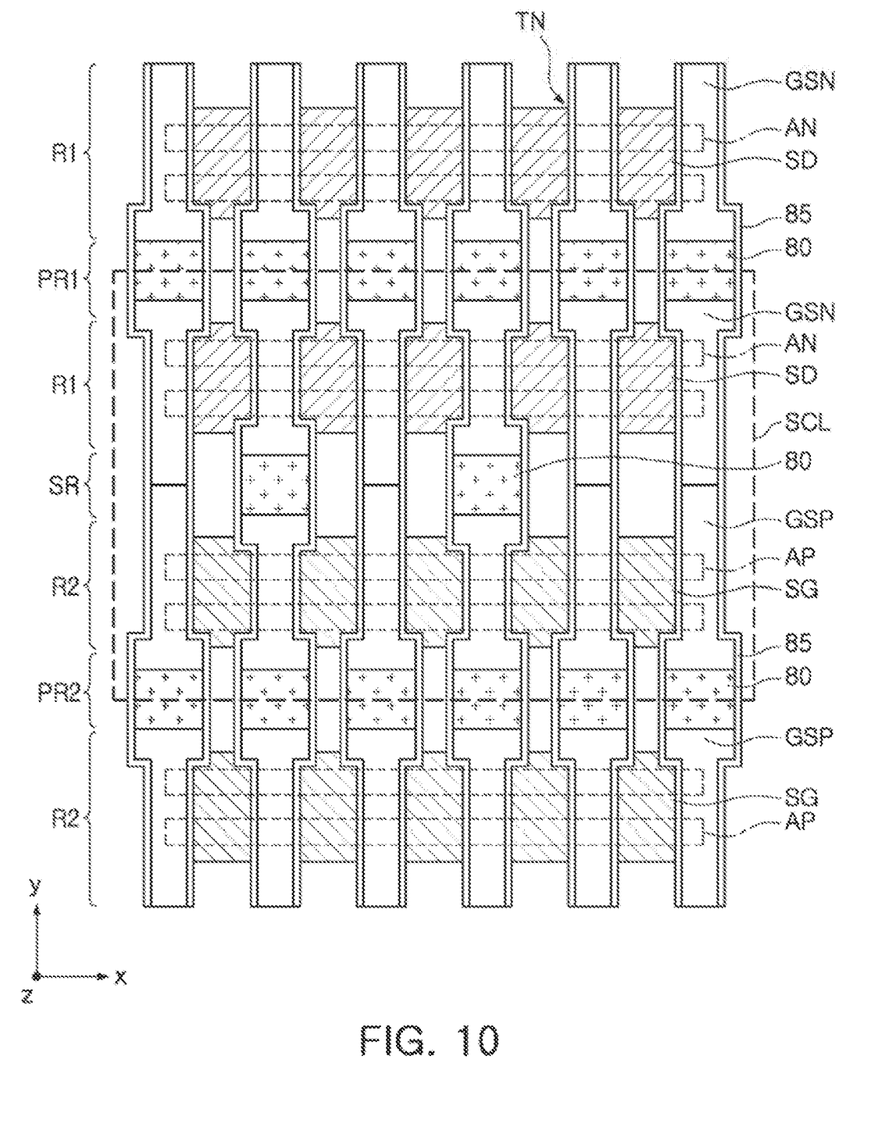
FIG. 10 is a plan view illustrating a semiconductor device according to an example embodiment of the present inventive concept.

FIG. 10 is a plan view illustrating a semiconductor device according to an example embodiment of the present inventive concept. The semiconductor device in FIG. 10 is similar to the semiconductor device in FIG. 1, and thus, mainly differences will be described hereafter.

Referring to FIG. 10, gate isolation patterns 80 may be disposed between at least one of the first gate structures GSN and at least one of the second gate structures GSP adjacent to one another in a separation region SR.

The at least one first gate structures GSN and the at least one second gate structures GSP with gate isolation patterns 80 disposed therebetween may each include end portions in contact with gate isolation patterns 80. For example, at least one first gate structure GSN and/or at least one second gate structure GSP with gate isolation patterns 80 disposed therebetween may include a first end in contact with a gate isolation pattern 80 disposed in the separation region SR and an opposite end in contact with a gate isolation pattern 80 disposed in the first power rail region PR1 or second power rail region PR2.

Figure 11:
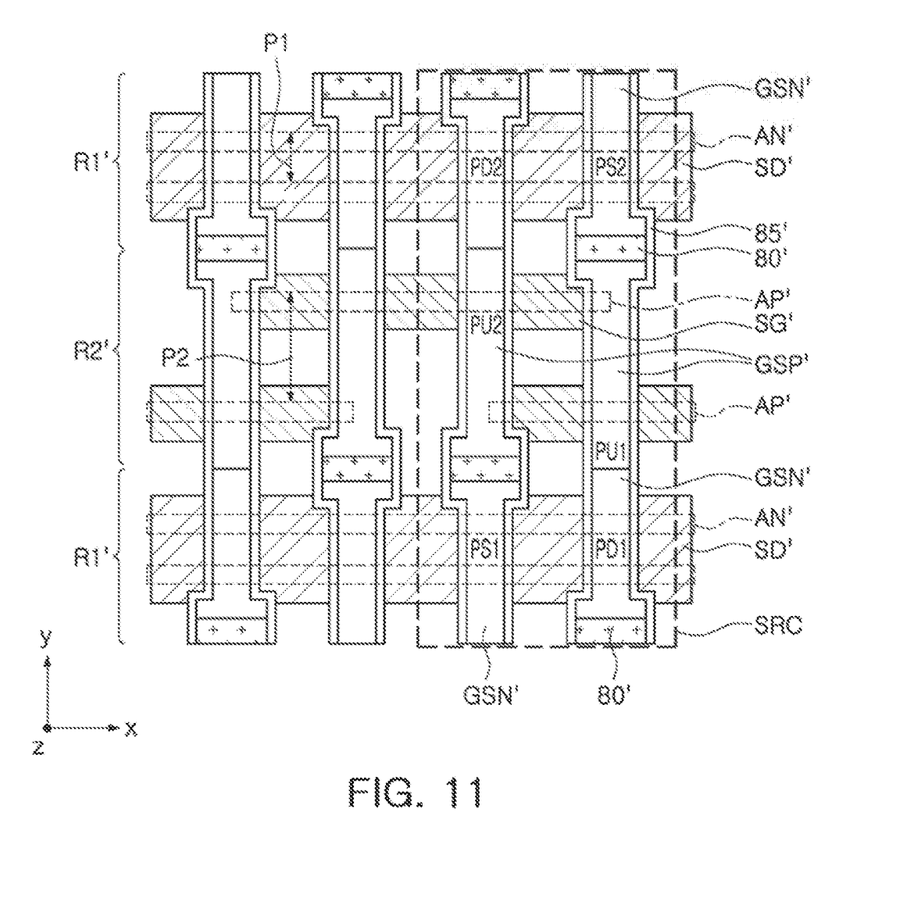
FIG. 11 is a plan view illustrating a semiconductor device according to an example embodiment of the present inventive concept.

FIG. 11 is a plan view illustrating a semiconductor device according to an example embodiment of the present inventive concept. FIG. 11 illustrates SRAM cells SRC configured to be six transistors, but the inventive concept is not limited thereto.

Referring to FIG. 11, the semiconductor device in the example embodiment of the present inventive concept may include the SRAM cells SRC disposed on a substrate. The SRAM cells SRC each may include first device regions R1' and second device regions R2' disposed between the first device regions R1'.

The first device regions R1' of the SRAM cells SRC may include a first N-type pull-down transistor PD1, a first N-type pass transistor PS1, a second N-type pull-down transistor PD2, and a second N-type pass transistor PS2. The second device regions R2' of the SRAM cells SRC may include a first P-type pull-up transistor PU1 and a second P-type pull-up transistor PU2.

The first N-type pull-down transistor PD1, the first N-type pass transistor PS1, the second N-type pull-down transistor PD1, the second N-type pass transistor PS2, the first P-type pull-up transistor PU1, and the second P-type pull-up transistor PU2 may include fin field-effect transistors (FinFETs).

The first device regions R1' may include P-type active regions AN' extending in the first direction (e.g. x direction) and having first pitches P1, first gate structures GSN' extending in the second direction (e.g. y direction) to intersect the P-type active regions AN', and N-type source/drain layers SD' disposed on the P-type active regions AN' and between the gate structures GSN'.

The second device regions R2' may include N-type active regions AP' extending in the first direction (e.g. x direction) and having second pitches P2, second gate structures GSP' extending in the second direction (e.g. y direction) to intersect N-type active regions AP', and P-type source/drain layers SG' disposed on the N-type active regions AP' between the second gate structures GSP'. The second pitches P2 may be greater than the first pitches P1. Lengths of the N-type active regions AP' extending in the first direction (e.g. x direction) may be shorter than lengths of the P-type active regions AN' extending in the first direction (e.g. x direction).

According to the example embodiments of the present inventive concept, the first device regions R1' may include two P-type active regions AN'. The second device regions R2' may include two N-type active regions AP'. The number of the P-type active regions AN' and the number of the N-type active regions AP' may vary. The P-type active regions AN' and the N-type active regions AP' may include fin-type active regions and/or active fins protruding from a substrate.

The first gate structure GSN' of the first N-type pull-down transistor PD1 may contact the second gate structure GSP' of the first P-type pull-up transistor PU1 at a boundary between the first device regions R1' and the second device region R2'. The first gate structure GSN' of the second N-type pull-down transistor PD2 may contact the gate structure GSP' of the second P-type pull-up transistor PU2 at a boundary between the first device regions R1' and the second device regions R2'.

A gate isolation pattern 80' may be disposed between the first gate structure GSN' of the first N-type pass transistor PS1 and the second gate structure GSP' of the second P-type pull-up transistor PU2. The gate isolation pattern 80' may be disposed between the gate structure GSN' of the second N-type pass transistor PS2 and the second gate structure GSP' of the first P-type pull-up transistor PU1. The gate isolation patterns 80' may be disposed at boundary regions between the first device regions R1' and the second device regions R2'.

Shapes of the first gate structure GSN' of the first N-type pass transistor PS1, the gate structure GSP' of the second P-type pull-up transistor PU2, the first gate structure GSN' of the second N-type pass transistor PS2, and the gate structure GSP' of the first P-type pull-up transistor PU1 may be similar to the examples described with reference to FIGS. 2, and 5 to 9. For example, the gate structure GSN' of the first N-type pass transistor PS1, the gate structure GSP' of the second P-type pull-up transistor PU2, the gate structure GSN' of the second N-type pass transistor PS2, and the gate structure GSP' of the first P-type pull-up transistor PU1 may include end portions similar to the examples described with reference to FIGS. 2, and 5 to 9.

Gate spacers 85' may be disposed to at least partially surround side surfaces of the gate structure GSN' and the gate structure GSP'. For example, the gate spacers 85' may continuously extend in the second direction (e.g. y direction) along the side surfaces of the gate structure GSN' and the gate structure GSP'. The gate spacers 85' may include bent portions.

By forming an end portion of the gate structure adjacent to the gate isolation pattern, according to the aforementioned example embodiments of the present inventive concept, defects caused by incomplete removal of a dummy gate may be decreased. Accordingly, a semiconductor device having increased production yield and reliability may be provided.

While the example embodiments of the present inventive concept have been shown and described above, it will be understood by one of ordinary skill in the art that modifications and variations in form and detail may be made therein without departing from the spirit and scope of the present inventive concept.

What is claimed is:

1. A semiconductor device, comprising:
an active region extending in a first direction on a substrate;
a first gate structure intersecting the active region, and extending along a gate line in a second direction perpendicular to the first direction;
a second gate structure extending along the gate line in the second direction; and
a gate isolation pattern disposed between the first gate structure and the second gate structure in the second direction,
wherein the first gate structure, the gate isolate pattern, and the second gate structure continuously extend along the gate line in the second direction, and the gate isolation pattern isolates the first gate structure from the second gate structure in the second direction,
wherein at least one of the first and second gate structure comprises a plurality of portions each having different widths in the first direction, and the gate isolation pattern has a width greater than a width of at least one of the plurality of portions of the at least one of the first and second gate structure,
wherein the plurality of portions includes a linear portion having a first width in the first direction and an end portion having a second width in the first direction that is greater than the first width,
wherein the end portion is in contact with the gate isolation pattern in the second direction, and
wherein the second direction is a lengthwise direction of the gate line.

2. The semiconductor device of claim 1, wherein the gate isolation pattern has a third width in the first direction that is greater than the first width, and
wherein each of the first direction and the second direction is parallel to an upper surface of the substrate.

3. The semiconductor device of claim 2, wherein the third width of the gate isolation pattern is substantially equal to the second width of the end portion in the first direction.

4. The semiconductor device of claim 2, wherein the end portion includes a first region having a width in the first direction that widens towards the gate isolation pattern in the second direction and a second region having the second width of a constant size.

5. The semiconductor device of claim 2, wherein the end portion includes a convex end surface in contact with the gate isolation pattern.

6. The semiconductor device of claim 2, wherein the end portion includes convex side surfaces.

7. The semiconductor device of claim 2, wherein the end portion includes concave side surfaces.

8. The semiconductor device of claim 1, wherein the gate isolation pattern includes a concave side surface in contact with one end portion of at least one of the first and second gate structure, and the one end portion of the at least one of the first and second gate structure protrudes towards the gate isolation pattern.

9. The semiconductor device of claim 2, further comprising:
a source/drain layer disposed on the active region adjacent to the at least one of the first and second gate structure,
wherein the source/drain layer includes a first portion adjacent to the linear portion of the at least one of the first and second gate structure, and a second portion adjacent to the end portion of the at least one of the first and second gate structure,
wherein the second portion has a width smaller than a width of the first portion in the first direction.

10. The semiconductor device of claim 1, wherein the plurality of portions includes a linear portion having a first end and a second end opposing each other in the second direction, a first end portion disposed at the first end of the linear portion, and a second end portion disposed at the second end of the linear portion, wherein the linear portion has a first width in the first direction, wherein the first end portion has a second width in the first direction that is greater than the first width, wherein the second end portion has a third width in the first direction that is greater than the first width, and wherein each of the first direction and the second direction is parallel to an upper surface of the substrate.

11. A semiconductor device, comprising:

an active region extending in a first direction on a substrate;

a first gate structure intersecting the active region, and extending along a gate line in a second direction perpendicular to the first direction, the first gate structure including a linear portion and an end portion adjacent to the linear portion;

a second gate structure extending along the gate line in the second direction;

a source/drain layer disposed on the active region adjacent to the first gate structure; and a gate isolation pattern disposed between the first gate structure and the second gate structure in the second direction, wherein the first gate structure, the gate isolation pattern, and the second gate structure continuously extend along the gate line in the second direction, and the gate isolation pattern isolates the first gate structure from the second gate structure in the second direction, wherein the linear portion and the end portion of the first gate structure each have different widths in the first direction, and the gate isolation pattern has a width greater than a width of at least one of the linear portion and the end portion of the first gate structure, wherein the end portion of the first gate structure is in contact with the gate isolation pattern in the second direction, and wherein the second direction is a lengthwise direction of the gate line.

12. The semiconductor device of claim 11, wherein the end portion includes a first region including a width in the first direction that widens towards the gate isolation pattern in the second direction, and a second region including a constant width in the first direction.

13. The semiconductor device of claim 11, wherein the end portion includes a convex end surface.

14. The semiconductor device of claim 11, wherein the end portion includes convex side surfaces.

15. The semiconductor device of claim 11, wherein the end portion includes concave side surfaces.

16. The semiconductor device of claim 11, wherein the gate isolation pattern has a concave end surface in contact with the end surface of the end portion of the first gate structure, and the end portion of the first gate structure protrudes towards the gate isolation pattern.

17. The semiconductor device of claim 11, wherein the source/drain layer includes a first portion adjacent to the linear portion of the first gate structure, and a second portion adjacent to the end portion of the first gate structure and having a width less than a width of the first portion in the first direction.

18. The semiconductor device of claim 11, further comprising:

first gate spacers disposed on first sidewalls of the linear portion of the first gate structure; and second gate spacers disposed on second sidewalls of the end portion of the first gate structure and connected to the first gate spacers, wherein in a plan view, a second width of the end portion in the first direction is greater than a first width of the linear portion in the first direction, wherein the first direction is a widthwise direction of the first gate structure and the second direction is a lengthwise direction of the first gate structure, wherein the first width of the linear portion is a distance in the first direction between the first sidewalls of the linear portion of the first gate structure that is in contact with each of the first gate spacers, and wherein the second width of the end portion is a distance in the first direction between the second sidewalls of the end portion of the first gate structure that is in contact with each of the second gate spacers.

19. A semiconductor device, comprising:

a first active region and a second active region each extending in a first direction on a substrate;

a first gate structure and a second gate structure each extending along a gate line in a second direction perpendicular to the first direction, and disposed adjacent to each other in the second direction; and a gate isolation pattern disposed between the first gate structure and the second gate structure in the second direction, wherein the first gate structure, the gate isolate pattern, and the second gate structure continuously extend along the gate line in the second direction, and the gate isolation pattern isolates the first gate structure from the second gate structure in the second direction, and wherein in a plan view the first gate structure includes a first linear portion and a first end portion, and a maximum width of the first end portion in the first direction is greater than a maximum width of the first linear portion in the first direction, wherein in the plan view, the second gate structure includes a second linear portion and a second end portion, and a maximum width of the second end portion in the first direction is greater than a maximum width of the second linear portion in the first direction, wherein the gate isolation pattern is in contact with the first end portion of the first gate structure and the second end portion of the second gate structure in the second direction, wherein the second direction is a lengthwise direction of the gate line, and wherein the gate isolation pattern has a width greater than at least one of the maximum width of the first linear portion and the maximum width of the second linear portion.

20. The semiconductor device of claim 19, wherein the semiconductor device further comprises a source/drain layer disposed on the first active region adjacent to the first gate structure, wherein the source/drain layer includes a first portion adjacent to the first linear portion of the first gate structure, and a second portion adjacent to the first end portion of the first gate structure, and wherein the second portion has a width smaller than a width of the first portion in the first direction.

* * * * *